United States Patent [19]

Op De Beek et al.

[11] Patent Number: 4,628,530
[45] Date of Patent: Dec. 9, 1986

[54] AUTOMATIC EQUALIZING SYSTEM WITH DFT AND FFT

[75] Inventors: Franciscus J. Op De Beek; Jacob M. Van Nieuwland, both of Eindhoven, Netherlands

[73] Assignee: U. S. Philips Corporation, New York, N.Y.

[21] Appl. No.: 579,737

[22] Filed: Feb. 13, 1984

[30] Foreign Application Priority Data

Feb. 23, 1983 [NL] Netherlands ............................ 8300671
Jul. 5, 1983 [TW] Taiwan ................................. 72-12206

[51] Int. Cl.⁴ ............................................. H03G 5/00
[52] U.S. Cl. ...................................... 381/103; 381/58; 364/576
[58] Field of Search ................. 364/572, 576; 381/59, 381/103, 56, 58, 107, 108, 96

[56] References Cited

U.S. PATENT DOCUMENTS

| 3,973,112 | 8/1976 | Sloane ............................ 364/576 |
| 4,458,362 | 7/1984 | Berkovitz et al. ............... 381/103 |
| 4,549,289 | 10/1985 | Schwartz et al. ............... 381/71 X |

FOREIGN PATENT DOCUMENTS

| 5439120 | 3/1979 | Japan ............................... 381/59 |
| 2068678 | 8/1981 | United Kingdom ............... 381/103 |

Primary Examiner—Forester W. Isen
Attorney, Agent, or Firm—Thomas A. Briody; William J. Streeter; Marianne R. Rich

[57] ABSTRACT

The equalizing arrangement in accordance with the invention comprises an equalizing unit (4) for correcting the frequency characteristic of an electric signal applied to its first input (7) under the influence of a control signal (10) applied to its second input (8) and for supplying a corrected electric signal to its output (9), and a frequency analyzing unit (16) having a first input (15) coupled to a point in the signal path between the input terminal (1) and the first input (7) of the equalizing unit (4), a second input (17) coupled to the pick-up means (14) and an output (19) for supplying the control signal (10).

The analyzing unit (16) is constructed to apply a Fourier transform to the previously digitized input signals x(t) and y(t) applied to its first and its second input, to compute Fourier-transformed signals $F_x(f)$ and $F_y(f)$ of these two signals and to compute a transfer function between these two signals.

Preferably the frequency analyzing unit is further constructed to compute a coherence function $\gamma^2_{xy}(f)$ between the two signals and, in determining the control signal, to ignore the values of the transfer function for those frequencies $f_i$ for which $\gamma^2_{xy}$ is smaller than a specific value, for example 0.8. By means of the arrangement in accordance with the invention a better equalization can be achived and the distortion of the output signal of the arrangement is low.

11 Claims, 9 Drawing Figures

AUTOMATIC EQUALIZING SYSTEM WITH DFT AND FFT

The invention relates to an arrangement for converting an electric signal into an acoustic signal, which arrangement comprises:

an input terminal for receiving an electric input signal, an electro-acoustic transducer unit for converting an electric signal into an acoustic output signal, an equalizing unit having a first and a second input and an output, for correcting the frequency characteristic of an electric signal applied to its first input under control of a control signal applied to its second input and for supplying the corrected electric signal on its output, an amplifier driving the electro-acoustic transducer unit, pick-up means for detecting an acoustic signal and for generating an electric signal which is a measure of the acoustic signal, and a frequency analyzing unit having a first input coupled to a point in the signal path between the input terminal and the first input of the equalizing unit, having a second input coupled to the detection means, and an output for supplying the control signal, which output is coupled to the second input of the equalizing unit.

The invention also relates to a frequency analyzing unit for use in conjunction with the arrangement in accordance with the invention. An arrangement of the type mentioned in the opening sentence is disclosed in British Patent Application GB No. 2,068,678A. The known arrangement is intended for the automatic correction (equalization) of the acoustic signal radiated by the transducer unit in an enclosed space (for example a living room or a motor-car compartment), although the invention is not limited to an arrangement for use in such spaces). As a result of the non-flat frequency characteristic of some components of the arrangement and the acoustic quality of the room in which the acoustic output signal is radiated an electric signal with a flat frequency response applied to the input terminal of the arrangement (for example a noise signal) is reproduced with distortion. As a result of this, the detection means (for example a microphone) arrangement in the space detect an acoustic signal whose frequency characteristic is no longer flat. In order to compensate for this non-flat frequency characteristic an equalizing unit is arranged in the circuit between the input terminal and the transducer unit. The equalizing unit is set to a frequency response which is the inverse of the frequency characteristic of the acoustic signal detected by the pick-up means. The setting of the equalizing unit is dictated by a control signal obtained from a frequency analyzing unit. This frequency analyzing unit comprises two filter banks with third octave or octave filters. The signal applied to the first input is divided into a number of frequency bands having the width of one third octave or one octave by one of the filter banks. The signal applied to the second input is also divided into an equal number of frequency bands having a width equal to a third octave or an octave by the other filter bank. For both signals the frequency-power content of each third octave or octave is determined. By comparing the frequency-power contents of corresponding third octaves or octaves of both signals a correction signal for each third octave or octave is derived. All the correction signals together form the control signal by means of which the equalizing unit is controlled.

However, the known arrangement has some drawbacks. Firstly, it does not always provide a satisfactory equalization and secondly it supplies an output signal which may be highly distorted. This is very undesirable.

It is the object of the invention to provide an arrangement which provides a more accurate and better equalization and which supplies an output signal with a substantially smaller distortion component. According to the invention the arrangement is characterized in that the frequency analyzing unit is constructed to subject the previously digitized input signals x(t) and y(t) applied to its first and second input to a Fourier transform (for example a discrete Fourier transform or DFT or a fast Fourier transform or FFT), to provide Fourier-transformed versions $F_x(f)$ and $F_y(f)$ respectively of said signals, to calculate a transfer function from the said two versions, and to determine the control signal using the information in this transfer function. The transfer function is either a complex function of the frequency and is then designated $H_{xy}(f)$ or a real function of the frequency, which is designated $|H_{xy}(f)|$ and therefore in fact corresponds to the absolute value of the complex transfer function $H_{xy}(f)$. The invention is based on the recognition of the following facts. The division in the known arrangement of the audible frequency range from, say, 20 Hz to 20 kHz when the two signals are analyzed by means of third octave or octave filters is not sufficiently accurate, especially for higher frequencies, viewed along a linear frequency scale. The width of third octave and octave filters increases as the centre frequency of the filters increases. Especially for higher frequencies this leads to an insufficiently accurate equalization. By the use of the Fourier-transform technique in the frequency analyzing unit in accordance with the invention, measurements in much narrower bands are possible. If an acoustic signal of 20 Hz to 20 kHz must be analyzed the signal must be sampled with a frequency of at least 40 kHz. When it is also assumed that 1024 samples are taken per measurement (the fast Fourier transform always employs $2^n$ samples, i.e. 512 or 1024 or 2048 etc. samples hereinafter the number of samples is assumed to be 1024 by way of example), which means that in the frequency domain 512 (complex) samples are obtained in the frequency range from 0-20 kHz, a bandwidth of $20.10^3/512 \sim 40$ Hz is obtained over the entire frequency range, i.e. also for the high frequencies. If the equalizing unit is a digitally operating equalizing unit the frequency response from 20 Hz to 20 kHz can be adapted in very small bands, i.e. for every 40 Hz in the present example. If the equalizing unit is a normal analog filter bank comprising for example third octave filters or if the equalizing unit comprises a plurality of parametric filters, the narrow-banded information of the transfer function in the frequency-analyzing unit must be converted into a control signal for each filter in the equalizing unit. In all the afore-mentioned cases some of the information contained in the transfer function may be ignored, as will become apparent from the following. As a result of this even an equalizing unit with third octave, octave or parametric filters will provide a better equalization.

Furthermore, the known arrangements do not allow for the possibility that the transducer unit or pick-up means may be located at or near a nodal line or a nodal point of one or more acoustic eigenmodes of the room. Acoustic eigenmodes are (acoustic) natural resonances (standing waves) which may arise in a room, see for example "Eigenmodes in non-rectangular reverberation rooms" by J. M. van Nieuwland and G. Weber, Paper G2, presented at the 9th International Congress on Acoustics (I.C.A.) in Madrid on July 4-9, 1977. The nodal lines or nodal points are those positions in the room where the acoustic field (the eigenmode) has a sound pressure equal to zero.

If the transducer unit is not situated on or near a nodal line or a nodal point and the pick-up means are situated on or near the said line or point, such an eigenmode is excited by the output signal of the transducer unit but this eigenmode will (substantially) not be detected by the pick-up means. However, if the transducer unit is situated on or near a nodal line or point the eigenmode is not excited and cannot consequently be detected, regardless of the location of the pick-up means. As a result of this the transfer function will have a very low value for the resonant frequency corresponding to this eigenmode.

Subsequently the frequency analyzing unit supplies a control signal to the equalizing unit, which ensures that the third octave filter corresponding to this resonant frequency additionally amplifies the electric signal in this frequency band. The electric signal boosted in the third octave filter by the equalizing unit is then converted into an acoustic signal which is boosted in the relevant frequency band. If the frequency analyzing unit is constructed so that equalization must be effected in one step, the instantaneous setting of the equalizing unit will be incorrect, which is of course undesirable.

If the arrangement operates in accordance with an iterative equalizing method the pick-up means again will not or hardly detect the amplified signal in the relevant frequency band in a next equalization step, so that the frequency analyzing unit again supplies a control signal to th equalizing unit to increase the electrical signal by additional amplification in said third octave filter. This results in a stepwise increase in gain. At a given instant the gain in the relevant third octave filter becomes too high, so that the signals in this frequency range become distorted when they are limited by the power supply or when the transducer unit becomes overloaded. This results in a high distortion of the output signal of the transducer unit, which is obviously also undesirable. Another problem which may occur is that the pick-up means are situated at a location in the room where destructive interference between a number of acoustic eigenmodes of the room takes place. This also results in the pick-up means detecting (hardly or) no signal in a specific frequency band, so that the transfer function in this band has a very small value. Again this leads to an incorrect setting of the equalizing unit or to a high distortion in the acoustic output signal, as explained above.

One step in accordance with the invention is to ignore the information in the transfer function in those frequency bands where the transfer function is unreliable, because the information in these frequency bands does not contribute to a further equalization of the frequency response, but is more likely to lead to distortion or to an incorrect equalization.

One method of ignoring unreliable information in the transfer function is to utilize the fact that in the aforementioned cases the transfer function in the relevant frequency bands has a very small value. This is achieved as follows. Firstly, the average value of the transfer function is determined. If for a specific frequency $f_i$ the value of the transfer function is smaller than 1/x times this average value, x being a number which is for example 20 or greater, this value of the transfer function corresponding to the said frequency is ignored. This means that when a digital equalizing unit is used or when an analog filter bank comprising for example third octave filters is used, the value of the transfer function at the relevant frequency $f_i$ is not used in generating a control signal for the relevant filter corresponding to this frequency $f_i$.

The result is that both a better equalization is obtained and the likelihood of distortion occurring in the output signal is reduced.

A preferred embodiment of the arrangement in accordance with the invention is characterized in that the frequency analyzing unit is also constructed to compute a coherence functions $\gamma^2_{xy}(f)$ between the two signals. The coherence function $\gamma^2_{xy}(f)$ represents the degree of coherence (or the degree of correspondence) between the two signals x(t) and y(t) applied to the two inputs of the frequency analyzing unit. The coherence function has a value between zero and one. If the coherence between the two signals in a specific frequency band is great the coherence function will be high in this frequency band. If the coherence is poor the coherence function in the relevant frequency band will be low. If the coherence function in a specific frequency band is low or high, respectively, this means that the reliability of the transfer function computed in conformity with the principal Claim is poor or satisfactory respectively in said frequency band.

Some causes of a poor coherence between the two signals x(t) and y(t) and consequently the unreliability of the transfer function have already been mentioned in the foregoing, namely if the transducer unit or pick-up means is situated on or near a nodal line or point of an eigenmode in the room or if the pick-up means are situated at a location in the room where destructive interference occurs between a plurality of modes. The relevant frequency bands yield a transfer function which has a very small value for these bands.

Another cause may be that the measurement of the transfer function is disturbed by background noise or other disturbing sounds, for example a continuous tone produced by an independent sound source. In the frequency bands within which these disturbing sounds occur the transfer function will therefore be unreliable. In general, the value of the transfer function in these bands will not be very small, so that the method of ignoring bands with unreliable information as described above cannot be used in the present case.

For ignoring all unreliable portions in the transfer function, regardless of the cause of the unreliability of these portions, an effective use can be made of the coherence function $\gamma^2_{xy}(f)$.

For this purpose the frequency analyzing unit is constructed to ignore, in determining the control signal, the values of the transfer function for those frequencies $f_i$ for which the coherence function $\gamma^2_{xy}$ is smaller than a specific value, for example 0.8. In principle, the value 0.8 is rather arbitrary. For example, for a higher value the reliability of the non-ignored part of the transfer function is higher. This means that, if ignoring takes place for coherence function values which are smaller than 0.7 or 0.6 the remainder of the transfer function will be less reliable so that a less effective equalization is apt to occur.

Moreover, the coherence function may be used as a test criterion for the number of times that averaging must be applied when determining the transfer function. The coherence function corresponding to a transfer function determined from a small number of measurements (i.e. a small number of times 1024 samples of the two signals x(t), which number must be greater than or equal to two), will be found to have a small value over the entire frequency range. Consequently, the transfer function is very unreliable. If now P measurements are carried out to determine P transfer functions, from which subsequently an average transfer function is determined, it will be apparent that for larger values of P the average transfer function becomes more reliable. Taken on an average, the coherence function corresponding to this transfer function will increase for increasing values of P. At a given instant a further increase of P will no longer lead to an (average) increase of the coherence function. This means that a further increase of the number of averages beyond a specific value P* no longer yields an increase in reliability of the transfer function, see "Obtaining good results from an experimental modal survey" by E. L. Peterson and A. L. Klosterman, A Technical Paper presented at the symposium of the society of Environmental Engineers in London, England in 1977. Thus, it is possible to determine from the coherence function the minimum number P* of averages which must be taken in order to obtain the most reliable transfer function possible.

Moreover, the use of the coherence function provides the possibility of applying equalization during normal use of the arrangement. The signal applied to the arrangement (for example a piece of music) then serves as the input signal applied to the first input of the frequency analyzing unit and the (music) signal picked up by the pick-up means then serves as an input signal which is applied to the second input of the frequency analyzing unit. If the musical passage should have no power content in a specific frequency band the transfer function in this frequency band will of course be very unreliable and should therefore not be used for equalization in this frequency band. Again the coherence function may be used. The coherence function in this frequency band will be found to have a very low value, so that the information contained in the transfer function in the said frequency band is then neglected automatically in determining the control signal for the equalizing unit.

It is to be noted that the theory and the practical implications of the fast Fourier transform technique are known per se, see for example (a) "Application of B & K Equipment to Frequency Analysis" by R. B. Randall, a publication by Brüel and Kjaer of September 1977, in particular Chapters 2, 5 and 6.

(b) "Random data: Analysis and Measurement Procedures" by J. S. Bendat and A. G. Piersol, Wiley—Interscience 1971, in particular Chapters 5 and 6.

(c) "Effective Measurements for Structural Dynamics Testing", Part 1 by K. A. Ramsey, Sound and Vibration, November 1975, pages 24-35.

Moreover, automatic equalization using the discrete frequency domain has also been applied in data transmission over telephone lines, see IEEE Transactions on Information Theory, Vol. IT-19, No. 1, January 1973, pages 59-68. The use of the (fast) Fourier transform technique in a frequency analyzing arrangement in accordance with the invention and the advantages and possibilities which can thus be obtained for the (automatic) equalization in a room, however, are not yet known.

An arrangement in accordance with the invention may further be characterized in that the frequency unit is constructed to delay, prior to the application of the Fourier transform, the signal applied to its first input relative to the signal applied to its second input by a time interval which at least substantially corresponds to the propagation delay of the acoustic output signal of the transducer unit to the pick-up means via the optimum path. The relevant time interval can be determined from either a measured impulse response $h(\tau)$ of the space into which the arrangement radiates its acoustic signal or from a cross-correlation function $R_{xy}(\tau)$ for the two signals x(t) and y(t).

If the impulse response is utilized a pulse-shaped test signal must be applied to the transducer unit before the arrangement is used normally. The pick-up means can then detect the response of the space—i.e. the impulse response $h(\tau)$—to this test signal. The said time interval may be taken as the time which elapses between the instant at which the test signal is applied to the transducer unit and the instant at which the pick-up means detect a signal for the first time, or the time which elapses between the instant at which the test signal is applied to the transducer unit and the instant at which an absolute maximum in the impulse response occurs. Frequently, though not always, these two time intervals will be equal to each other.

If the relevant time interval is determined from the cross-correlation, this yields the advantage that this is possible during normal use of the arrangement. The signals x(t) and y(t) are then used (for example normal music signals which are reproduced by the arrangement), from which the cross-correlation function can be derived by means of Fourier techniques. The relevant time interval is now obtained by taking that value for $\tau$ for which the absolute value of the cross-correlation function has a (namely the highest) maximum. The value for the time interval obtained by the various methods now corresponds to the propagation delay of the acoustic waves between the transducer unit and the pick-up means. If the transducer unit and the pick-up means at least substantially face each other this optimum path corresponds to the shortest path (distance) between them. When they are not directed towards each other the optimum path from the transducer unit to the pick-up means may extend via a (reflection from a) wall of the room.

If the first signal is now delayed by said time interval $\tau$ a better correspondence between the two signals x(t) and y(t) can be obtained. As a result of this, the coherence function will be better (the coherence function is then greater than for example 0.8 for larger frequency ranges) and the calculated transfer function will also be better. Consequently, the equalization will also be better.

Preferably, the frequency analyzing unit will also be constructed to limit the length of the two signals by means of a time window after the signal applied to its first input has been delayed and before the Fourier transform is applied, the length of the time window roughly corresponding to the time interval within which the pick-up means detect the direct acoustic output signal of the transducer unit and a plurality of early reflections of the acoustic signal from the transducer unit. This step is based on the recognition of the fact that the aural sensation of a listener who receives an acoustic (stereo) signal via the transducer unit mainly depends on the direct sound and the so-called early reflections. These are the reflections which reach the listener up to a maximum of 40 to 50 ms after the arrival of the direct sound. Therefore, the length of the time window is 40 to 50 ms at the maximum, but it may be shorter depending on the decay as a function of time of the signal received by the pick-up means. Also in this case the impulse response $h(\tau)$ may be used. For example, if the amplitude of the impulse response has decreased to half (or another fraction, for example one third) of the maximum amplitude (which is the amplitude of the direct sound at the time of arrival), this instant determines the end of the time window.

The cross-correlation function $R_{xy}(\tau)$ described in the foregoing may also be utilized for determining the length of the said time window. Each reflection in a (relative maximum in the curve of the absolute value of the cross-correlation function $|R_x(\tau)|$. The length of the time window now corresponds to the time interval $\tau_1 - \tau_0$, where $\tau_0$ is the value of $\tau$ for which $|R_{xy}|$ has an absolute maximum (caused by the direct sound) and $\tau_1$ is the highest value of $\tau$ for which a relative maximum of $|R_{xy}|$ still has a value equal to one half (or another fraction, for example one third) of the said absolute maximum.

The invention also relates to arrangements for the reproduction of a stereophonic signal. To this end the arrangement may be further characterized in that for the conversion of a stereophonic signal into an acoustic signal the arrangement is provided with a second input terminal for receiving a second electric input signal, a second electro-acoustic transducer unit for converting the second electric input signal into a second acoustic output signal, a second amplifier for driving the second electro-acoustic transducer unit, that the equalizing unit is further provided with a third and a fourth unit and a second output and is constructed to correct the frequency characteristic of the second electric signal applied to its third input under the influence of a second control signal applied to its fourth input and to supply the corrected second electric signal to its second output, that the frequency analyzing unit is provided with a third input coupled to a point in the signal path between the second input terminal and the third input of the equalizing unit and a second output for supplying the second control signal, which second output is coupled to the fourth input of the equalizing unit, the frequency analyzing unit being moreover constructed to perform a Fourier transform on the previously digitized input signal z(t) applied to its third input, to provide a Fourier-transformed version $F_z(f)$ of this signal z(t), to compute a second transfer function from the said transformed versions of the two signals z(t) and y(t), to determine the second control signal using the information in this second transfer function, to compute partial coherence functions $\gamma^2_{xy.z}(f)$ between the signals x(t) and y(t) and $\gamma^2_{zy.x}(f)$ between the signals z(t) and y(t), and is constructed to ignore, in determining the first and the second control signal respectively, the value of the first and the second transfer function respectively for those frequencies $f_{i2}$ for which the partial coherence $\gamma^2_{xy.z}(f)$ and $\gamma^2_{zy.x}(f)$ respectively has a value smaller than a specific fixed value, said fixed value lying preferably between 0.7 and 1.0. Via the said input terminal for example the left-hand signal may be applied to the arrangement and via the second input terminal the right-hand signal may be applied to the arrangement. Since the pick-up means detect an acoustic signal from both said first transducer unit and said second transducer unit the partial coherence functions must now be computed for determining the reliability of the computed transfer functions (and consequently for determining which frequency bands in the transfer functions must be ignored or must not be ignored in determining the first and the second control signal). The theory of partial coherence functions is known per se, see (b), Chapter 5.4. However, the use of partial coherence functions in arrangements in accordance with the invention is not known.

It is obvious that the steps, described in the foregoing, of delaying one signal relative to the other and of limiting the length of the signals by means of a time window may also be applied to the stereophonic version of the arrangement.

The invention will now be described in more detail with reference to the drawings. In the drawings.

Figure 3A:
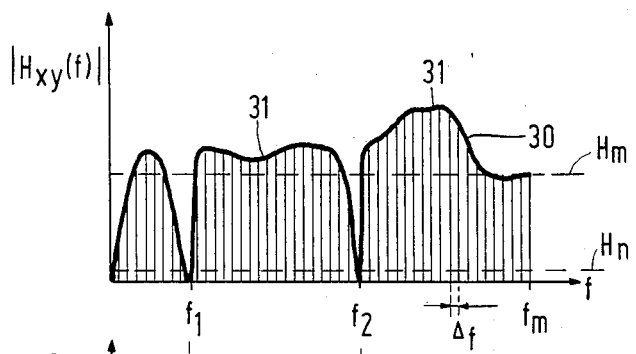
Figure 3B:
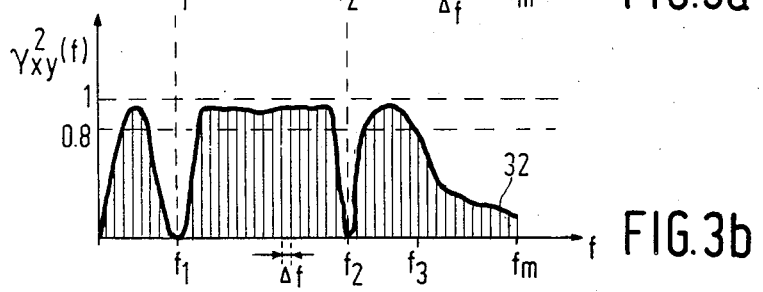
Figure 4A:
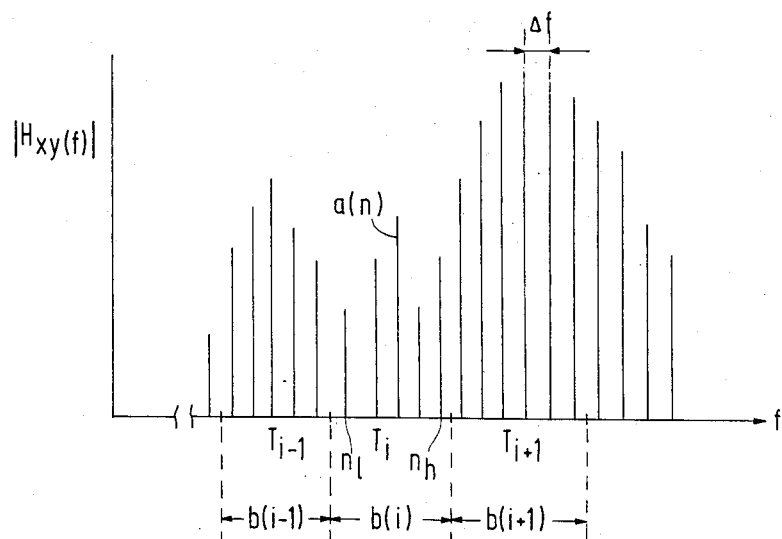
Figure 4B:
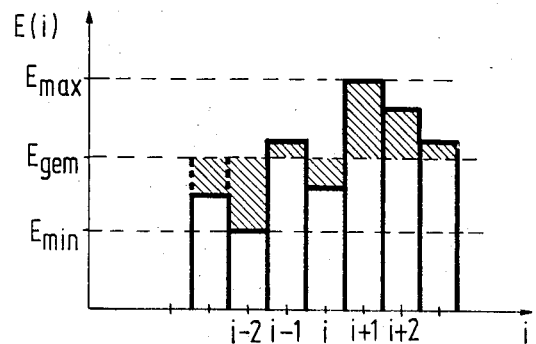
Figure 5:
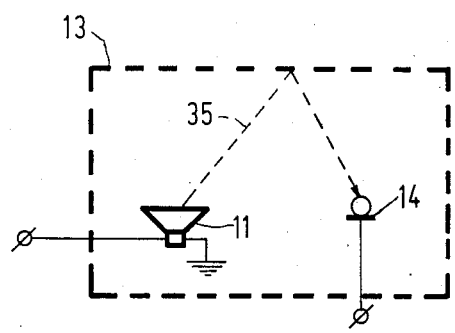
Figure 6:
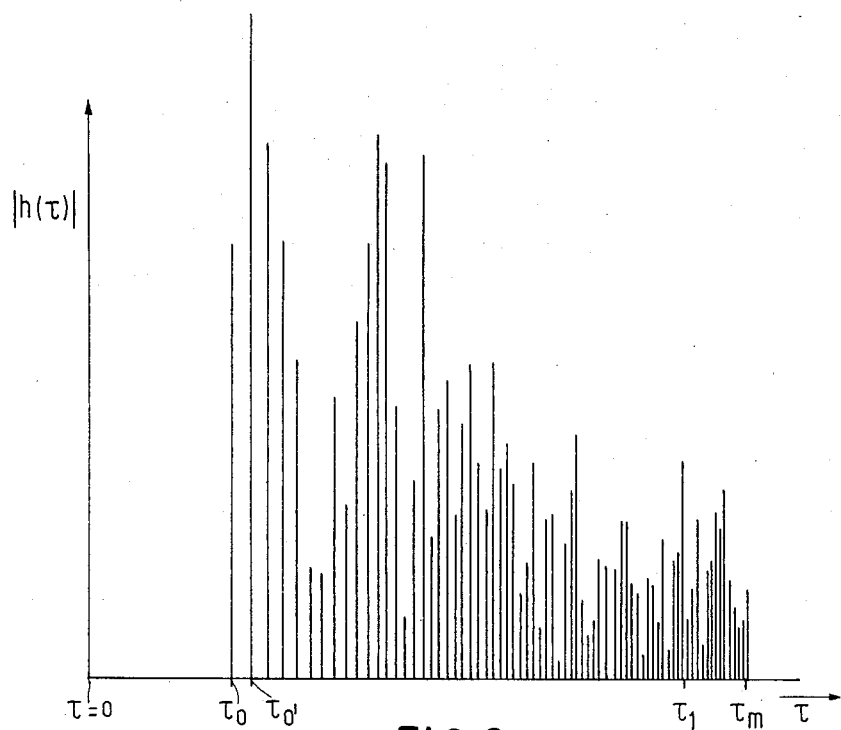
Figure 7:
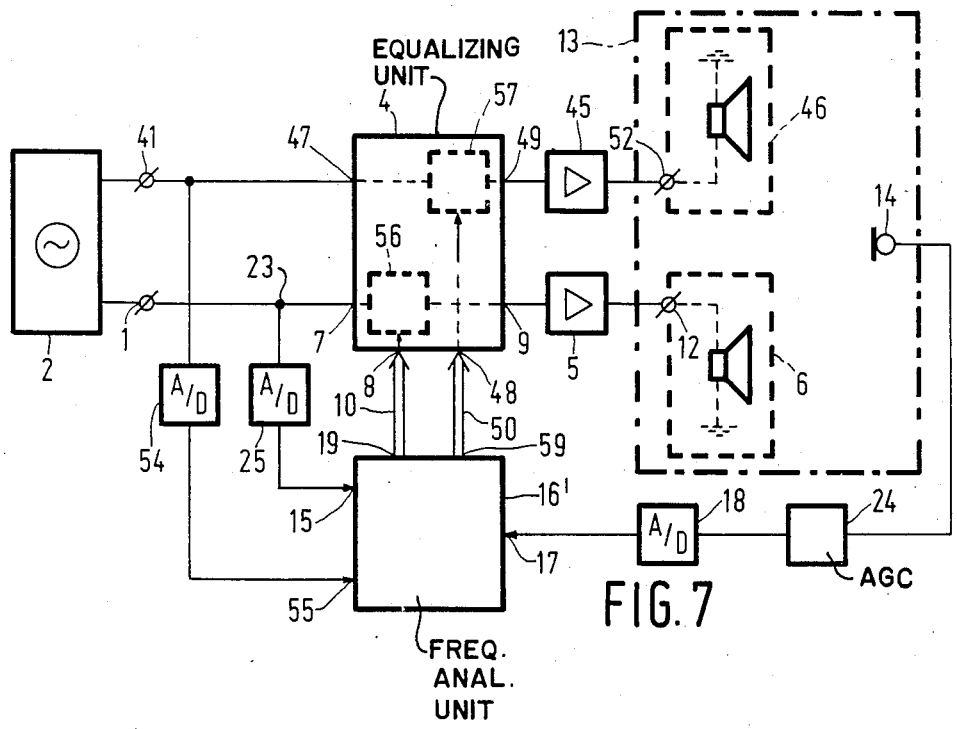

FIG. 3a represents a transfer function $|H_{xy}(f)|$ and FIG. 3b a coherence function $\gamma^2_{xy}(f)$ as a function of the frequency, FIG. 4a represents a part of the transfer function of FIG. 3a and FIG. 4b shows the result of the conversion of the information contained in the transfer function of FIG. 4a to wider frequency bands, FIG. 5 shows a different arrangement of the transducer unit and the detection means in a room, FIG. 6 illustrates the impulse response $h(\tau)$ of a space, and FIG. 7 shows an embodiment of the invention for the reproduction of a stereophonic signal.

Parts in the figures bearing the same reference numerals have the same functions.

Figure 1:
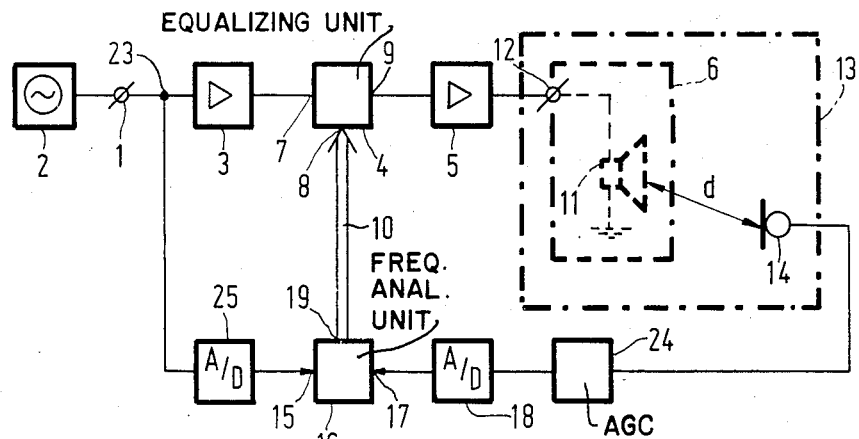
FIG. 1 shows an embodiment of the invention.

FIG. 1 shows an arrangement having an input terminal 1 for receiving an electric input signal from a signal source 1. The signal source 2 may supply a monophonic signal as indicated in FIG. 1. However, the signal source may alternatively supply a stereophonic signal. The last-mentioned situation is shown in more detail in FIG. 7. Via a preamplifier 3 the input terminal 1 is connected to a first input 7 of an equalizing unit 4, which also has a second input 8 and an output 9. The equalizing unit is constructed to correct the frequency characteristic of an electric signal applied to its first input 7 under the influence of a control signal which is applied to the second input 8 via the line 10, and to deliver the corrected electric signal on its output 9. The output 9 of the equalizing unit 4 is connected to a transducer unit 6 via an amplifier 5. The transducer unit 6 may comprise one or more loudspeakers 11. The transducer unit 6 is intended for converting the electric signal applied to its input 12 into an acoustic output signal which is radiated into a room 13. In the room 13 pick-up means 14 in the form of a microphone are arranged, for detecting the acoustic signal in the room 13 and for generating an electric signal which is a measure of this acoustic signal. A point 23 in the signal path between the input terminal 1 and the first input 7 of the equalizing unit 4 is connected to a first input 15 of a frequency analyzing unit 16 via an analog-to-digital converter 25. The output of the pick-up means 14 is connected to a second input 17 of the frequency analyzing unit 16 via a preamplifier or an automatic gain control 24 an analog-to-digital converter 18. The element 24 is intended for amplifying the signal from the pick-up means so that the signal level is compatible with the measuring range of the A/D converter 18. If the element 24 is a preamplifier its gain must be controlled by the frequency analyzing unit 16. If the element 24 is an automatic gain control circuit it must operate very slowly. The gain of the a.g.c. should not change during the time of a measurement (corresponding to the time occupied by a data block of, say, 1024 samples). Furthermore, the frequency analyzing unit 16 has an output 19 for supplying a control signal to the second input 8 of the equalizing unit 4 via the line 10. The frequency-analyzing unit 16 is constructed to subject its input signals x(t) and y(t) which input signals are digitized by the analog-to-digital converters 25 and 18 and then applied to its first input 15 and its second input 17 to a Fourier transform (DFT or FFT) to produce the Fourier-transformed versions $F_x(f)$ and $F_y(f)$ respectively of the two signals, to compute the transfer function from the two versions and to determine the control signal from the information contained in said transfer function.

Preferably the transfer function $H_{xy}(f)$ is calculated by means of the following formula:

$$H_{xy}(f) = \frac{G_{xy}(f)}{G_x(f)} = \frac{F_x^*(f)F_y(f)}{F_x^*(f)F_x(f)} \qquad (1)$$

see (b), Chapter 5.2, pages 145 and 147 and formula (5.29). In this formula $F_x^*(f)$ is the complex conjugate function of $F_x(f)$, $G_{xy}(f)$ the (complex) cross spectrum of the signals x(t) and y(t), and $G_x(f)$ the auto-spectrum (a real function) of the signal x(t). Since $G_{xy}(f)$ is a complex function the transfer function $H_{xy}(f)$ is also a complex function of the frequency. The transfer function derived from the signals x(t) and y(t) is not always reliable. This may have the following causes:

(i) The transducer unit is located on or near a nodal line or nodal point of an eigenmode in the room 13.

(ii) The pick-up means are situated on or near a nodal line or nodal point of an eigenmode in the room 13.

(iii) The pick-up means are disposed at a location in the room 13 where destructive interference between a plurality of eigenmodes occurs.

(iv) The measurement of the transfer function is impaired by background noise (a random signal).

(v) The measurement of the transfer function is disturbed by a continuous non-random signal, such as a continuous tone.

(vi) Miscellaneous other causes.

Figure 2:
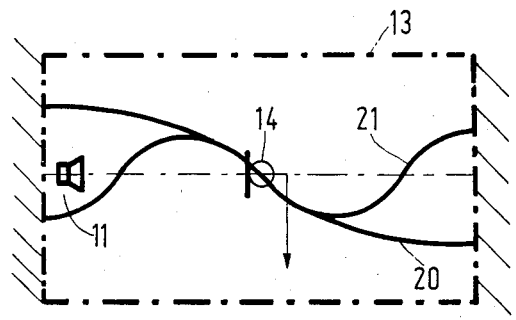
FIG. 2 shows room with two eigenmodes.

The first three causes are characterized by a very low value for the transfer function in the relevant frequency band. This will be explained with reference to FIG. 2 and FIG. 3a. In FIG. 2 the pick-up means are located exactly on a nodal line or point of an eigenmode in the room 13.

FIG. 2 represents two acoustic eigenmodes (or standing waves) 20 and 21 which may occur in the longitudinal direction of the room 13 and which are excited by the output signal of the loudspeaker 11. The amplitude of the sound pressure is plotted in the vertical direction. The eigenmode 20 has a resonant frequency $f_1$ which is equal to one third of the resonant frequency of the eigenmode 21. The pick-up means 14 are located exactly at a nodal point of the two eigenmodes. At this location both eigenmodes have a sound pressure equal to zero. The pick-up means 14 will detect no signal content for the corresponding resonant frequencies. This is illustrated by FIG. 3a. The same applies to the case in which the transducer unit is located on or near a nodal line or point, that is, in FIG. 2 at the location where now the pick-up means 14 are located, which pick-up means are then situated at another location. The two eigenmodes would then not be excited. The foregoing also applies if destructive interference between a number of modes occurs at the location of the pick-up means.

In FIG. 3a the curve 30 represents the transfer function $|H_{xy}(f)|$. This transfer function corresponds to the absolute value of the (complex) transfer function $H_{xy}(f)$. Hence, the transfer function $|H_{xy}(f)|$ is a real function of the frequency. Since sampled signals are used for the computation of a transfer function by means of a Fourier transform, the computed transfer function also comprises samples as indicated by 31 and the continuous curve 30 is not obtained. The frequency $\Delta f$ between two samples is equal to $$\Delta f = \frac{f_m}{\frac{1}{2}N} = \frac{\frac{1}{2}f_s}{\frac{1}{2}N} = \frac{f_s}{N} \qquad (2)$$

where $f_m$ is the upper limit of the transfer function (i.e. for example 20 kHz), $f_s$ is the sampling frequency and N is the number of samples for one measurement, see (c) in the Chapter "The transfer and coherence functions". Thus, the transfer function comprises N/2 samples situated between f=0 and f=$F_m$. Around and at the frequencies $f_1$ and $f_2$ the transfer function has a very low value, as can be seen. As set forth in the introductory part, the known arrangements would tend to correct this, which would ultimately result in an incorrect setting of the arrangement (in the case that one equalization step is required) or (in the case that the arrangement operates in accordance with an iterative equalization method) the gain becoming too high and the acoustic output signal of the arrangement being seriously distorted. This is undesirable. In accordance with the invention the information in the transfer function around and at the frequencies $f_1$ and $f_2$ must be ignored in determining the control signal for the equalizing unit 4.

One possibility of achieving this is to ignore those samples in the transfer function which have values smaller than 1/x times the means value $H_m$ of the transfer function, i.e. $H_n.H_m$ may be determined by taking the sum of the values of all the samples 31 in the transfer function $|H_{xy}(f)|$ and subsequently dividing this sum by the number of samples (which is $\frac{1}{2}N$). It is evident that a number of samples in the frequency band around $f_1$ and $f_2$ have a smaller value than $H_n$ and will therefore be omitted. The effect of cause (iv) on the reliability of the measured transfer function can be reduced or even be eliminated by determining the transfer function $P_1$ times and subsequently determining the mean transfer function. Noiselike components in the interference signal (cause iv) are then averaged out. The influence of causes (v) and (vi) is not directly apparent from the shape of the transfer function. Therefore, the resulting unreliable frequency bands in the transfer function cannot be determined and ignored by the above method. A better method of determining and subsequently ignoring the unreliable frequency bands in the transfer function is the use of the coherence function $\gamma_{xy}^2(f)$. This method functions correctly regardless of the cause of the unreliability in the transfer function. In FIG. 3b the curve 32 represents the coherence function is calculated with the following formula:

$$\gamma_{xy}^2(f) = \frac{|G_{xy}(f)|^2}{G_x(f)G_y(f)} \quad (3)$$

see (b), Chapter 5.2, page 145, formula (5.30). In this formula $|G_{xy}(f)|^2$ is the square of the absolute value of the cross-spectrum, which is calculated by multiplying the cross-spectrum by the complex conjugate cross-spectrum, and $G_y(f)$ the auto-spectrum (a real function) of the signal y(t). Since all terms in (3) are real $_{xy}{}^2(f)$ is also real and also complies with the following relationship:

$$0 \leq \gamma_{xy}^2(f) > 1, \quad (4)$$

see (b), Chapter 5.2, page 142, formula (5.24). In fact, in the same way as for the transfer function, the continuous curve 32 is not obtained but only ½N samples (or values) between f=0 and f=$f_m$. Therefore, $\Delta f = f_m/\frac{1}{2}N$ is valid, see also (c) in the Chapter "The transfer and coherence functions".

The coherence function is a measure of the reliability of the computed transfer function. If in a specific frequency band the coherence function has a high value (for example>0.8), the reliability of the transfer function in this band is satisfactory. If the coherence function has a lower value the transfer function will be less reliable. FIG. 3b clearly shows that the coherence function has a low value in the frequency bands around $f_1$ and $f_2$. In these bands the transfer function $|H_{xy}(f)|$ is therefore unreliable. Thus, by ignoring in the transfer functions the samples at those frequencies for which the coherence function has a value smaller than 0.8 only the reliable information of the transfer function is maintained and may be used for determining the control signal for the equalizing unit 4. It is evident that in this case the frequency bands around $f_1$ and $f_2$ will also be ignored.

Moreover, it is apparent that a frequency band at f=0 and above f=$f_3$ is also ignored. This may be due to the causes mentioned under (v) and (vi). Examples of various other causes are:

the frequency content of the signal x(t) may be limited to for example frequencies below $f_3$. The information in $|H_{xy}(f)|$ for frequencies above $f_3$ is then not reliable and must not be used for the equalization.

at very low frequencies, from f=0 to about 100 Hz, which is the lower limit of the operating frequency range of the transducer, the transducer unit cannot reproduce signals. The information in this frequency range of the transfer function is therefore also unreliable and must also be ignored.

The further computation using the information in the transfer function is as follows. The frequency range of transfer function $|H_{xy}(f)|$ from f=0 to f=$f_1$ is firstly divided into a number of frequency bands. Each frequency band corresponds to the frequency band of an associated filter of the equalizing unit. For example, if the equalizing unit comprises third octave filters, the frequency axis in FIG. 3a is divided into frequency bands having a width of one third octave. This is illustrated in FIG. 4a. FIG. 4a shows three frequency bands $T_{i-1}$, $T_i$ and $T_{i+1}$ corresponding to three (third octave) filters having a bandwidth of b(i−1), b(i) and b(i+1) Hz respectively.

The samples (values) of the transfer function $|H_{xy}(f)|$ are designated a(n),. Therefore $$|H_{xy}(n\Delta f)| = a(n)$$

is valid, n ranging from 0 to N/2.

For each frequency band i the energy content E(i) is now determined as follows:

$$E(i) = \left\{ \frac{1}{n_h - n_1 + 1} \sum_{n=n_1}^{n_h} a^2(n) \right\} b(i) \quad (5)$$

in which $n_1$ is the sequence number of the sample within the frequency band i with the lowest sequence number and $n_h$ is the sequence number of the sample within the frequency band i with the highest sequence number.

In formula (5) normalization is effected by dividing the number of samples, which is $n_h - n_1 + 1$, within the frequency band i. Ignoring one or more samples has the following effect on the calculation of E(i) with formula (5): For each a(n) within the frequency band i for which the associated value $\gamma^2_{xy}(n)$ of the coherence function is smaller than (for example) 0.8.

the value zero is taken for the relevant a(n), and the quantity $n_h - n_1 + 1$ is decremented by one in the calculation of E(i) in accordance with formula (5). For each of the frequency bands this yields a value E(i). By way of example a number of values are given in columns corresponding to a number of values i in FIG. 4b.

Subsequently an average energy content $E_{gem}$ is determined. This may be achieved by taking the sum of all values E(i) and dividing this sum by the number of values. However, preferably $E_{gem}$ *is determined by means of the following formula*

$$E_{gem} = \frac{E_{max} + E_{min}}{2},$$

where $E_{max}$ is the maximum energy content and $E_{min}$ the minimum energy content present for the frequency bands i. FIG. 4b shows that the frequency band i+1 has the highest and the frequency band i−2 has the lowest energy content. The differences E(i)−$E_{gem}$ are a measure of the extent to which the frequency response curve is non-flat. In FIG. 4b these differences are indicated by hatched portions. Using these differences the frequency-analyzing unit 16 now supplies a control signal S(i) for each (third octave) filter in the equalizing unit 4 corresponding to the associated frequency band i in the transfer function.

The control signal S(i) is now related as follows to the energy content of the corresponding frequency band i:

$$S(i)(:) - \alpha\{E(i) - E_{gem}\} = -\alpha\left( E(i) - \frac{E_{max} + E_{min}}{2} \right) \quad (6)$$

For one-step equalization $\alpha=1$ and for an iterative equalization method $\alpha$ is smaller than one, for example 0.9. It follows from formula (6) that under the influence of the control signal S(i) the gain in a filter i of the equalizing unit corresponding to a frequency band in the transfer function having an energy content E(i) greater than $E_{gem}$ (such as the frequency band designated i+1 in FIG. 4b) and smaller than $E_{gem}$ (such as the frequency band i−1) must be reduced and increased respectively. In the case of one-step equalization the correct gain setting of the filters in the equalizing unit is then obtained at once. If an iterative equalizing method is used the above operation is repeated until the correct setting of the equalizing unit is obtained.

An improvement to the equalizing method described above can be obtained by, prior to subjecting the signals applied to the inputs 15 and 17 of the frequency analyzing unit 16 to the Fourier transform, delaying the signal applied to input 15 by a time interval which at least roughly corresponds to the propagation delay of the acoustic output signal of the transducer unit 6 to the pick-up means 14 via the optimum path. In the example of FIG. 1 this corresponds to the shortest path between the loudspeaker 11 and the microphone 14. The time interval is then equal to d/c, d being the length of said shortest path and c being the velocity of propagation of the acoustic waves in air.

FIG. 5 shows an arrangement of a loudspeaker 11 and a microphone 14 for which the optimum path 35 between these two elements extends via a reflection from a wall 13 of the room. The signal on input 17 then reaches this input 17 with a delay relative to the signal applied to input 15 as a result of the propagation delay between the transducer unit 6 and the pick-up means 14. In order to ensure that the correct signals are used in the frequency-analyzing unit for determining the transfer function, a correction for said propagation delay must be applied, which can be achieved by delaying the signal on input 15 by the same time interval. The length of this time interval can be determined from either an impulse response $h(\tau)$ of the room or a cross-correlation function $R_{xy}(\tau)$ between the two signals x(t) and y(t).

FIG. 6 represents the absolute value of the response of a room 13 to a pulse-shaped signal which is produced in the room via the transducer unit at the instant $\tau=0$. This response or impulse response $h(\tau)$ clearly shows that the acoustic signals reach the pick-up means delayed by a certain time $\tau_0$. This time $\tau_0$ is the required length of the time interval. However, alternatively it is possible to take the value $\tau'_0$, corresponding to the instant at which the impulse response reaches its maximum amplitude. Said time delay may also be derived from the cross-correlation function $R_{xy}(\tau)$. This is more advantageous because no separate test signal is required but direct use can be made of the signals x(t) and y(t). The cross-correlation function is obtained by applying an inverse Fourier transform to the cross-spectrum $G_{xy}(f)$, see (a), Chapter 6.5. The cross-correlation function can be obtained in a simple manner because the cross-correlation function can be obtained simply because the cross-spectrum has to be determined anyway for computing the transfer function $H_{xy}(f)$, see formula (1). The curve of the absolute value of the cross-correlation function, i.e. $|R_{xy}(\tau)|$, exhibits a number of maxima, of which the first maximum, on going from $\tau=0$, to a higher value of $\tau$, has the highest value. The value of $\tau$ for which this maximum occurs is then the said time delay $\tau_0$.

By delaying the signal x(t) applied to the first input 15 of the frequency analyzing unit 16 by said propagation delay, data blocks of the two signals which correspond better in time are used for the calculation of the transfer function. This yields a better (more reliable) transfer function. As a result of this, larger frequency bands will have a coherence function greater than or equal to (for example) 0.8 so that less information in the transfer function needs to be ignored.

A further improvement to the equalization method described above can be obtained if, prior to the Fourier transformation of the two signals and after delaying the signal applied to the first input 15, the length of the two signals is limited by means of a time window, the length of the time window corresponding roughly to the time interval within which the pick-up means 14 receive the direct acoustic output signal of the transducer unit (i.e. which direct signal arrives at the pick-up means starting from the instant $\tau_0$) and a number of early reflections of this signal are detected. These reflections manifest themselves in the impulse response $h(\tau)$ and in the cross-correlation function $|R_{xy}(\tau)|$ as a number of relative maxima for longer time intervals $\tau$ after $\tau_0$ (see FIG. 6).

The criterion determining which reflections must be regarded as early reflections may be that those reflections are taken into account for which the corresponding (relative) maximum has a value greater than or equal to, for example, one third of the absolute maximum at the instant $\tau'_0$. In FIG. 6 this corresponds to the value $\tau_1$. $\tau_1$ can be derived from the cross-correlation function in a similar manner. It will be apparent from FIG. 6 that the time window $\tau_1 - \tau_0$ is smaller than the length of the data block of N (=1024) samples required for the calculation of the transfer function. The length of the data block of N (=1024) samples is equal to $\tau_m$. In order to enable the transfer function to be determined in spite of this, the time-limited signals are supplemented with zeros (termed "zero fill") until data blocks of a length $\tau_m$ are obtained.

This reduction of the signal length is useful because the perception of a listener who receives an acoustic (stereo) signal via the transducer unit mainly depends on the direct sound and the so-called early reflections. These are the reflections which reach the listener up to a maximum of 40 to 50 ms after the arrival of the direct sound. This means that $\tau_1 - \tau_0$ has a maximum value of 40 to 50 ms.

If the signal source 2 supplies a digital signal a digital-to-analog converter must be arranged before or after the equalizing unit 3 (depending on the circuit design of the equalizing unit), the analog-to-digital converter 25 and the amplifier 3 may then be dispensed with.

It has already been stated that for a sampling frequency of 40 kHz, which is the minimum frequency necessary for analyzing an acoustic signal of 20 Hz to 20 kHz, and 1024 samples per measurement a bandwidth of 40 Hz is obtained. For frequencies above, say, approximately 250 Hz, this bandwidth is smaller than the bandwidth of the corresponding third octave in this range, which consequently provides an improvement in comparison with measurements by means of third octave filters. For frequencies below 250 Hz the situation is the other way around. In order to enable measurements in bands which are narrower than those of third octave filters the frequency range to 20 kHz is divided into two parts. One part from 0 Hz to, for example, 250 Hz and a second part from 250 Hz to 20 kHz. By sampling each part with a separate sampling frequency, taking 1024 samples for each of both measurements, and recombining the two measurements for obtaining the transfer function over the entire frequency range, the desired frequency resolution can be obtained over the entire frequency range, that is also for the low frequencies.

FIG. 7 shows an embodiment of the arrangement in accordance with the invention by means of which a stereophonic signal can be reproduced. For this purpose the arrangement comprises a second input terminal 41 for receiving a second electric input signal applied by the source 2, a second electro-acoustic tranducer unit 46 for converting the second electric signal into a second acoustic output signal, and a second amplifier 45 for driving the second transducer unit 46. Furthermore, the equalizing unit 4 is provided with a third and a fourth input, 47 and 48 respectively, and a second output 49 and the unit is constructed to correct the frequency characteristic of the second electric signal applied to its third input under the influence of a second control signal 50 applied to its fourth input 48 and to supply the corrected second electric signal to its second output 49. The frequency analyzing unit 16' is also provided with a third input 55, coupled to a point on the signal path between the second input terminal 41 and the third input 47 of the equalizing unit, and a second output 59 for supplying the second control signal 50, which second output 59 is coupled to the fourth input of the equalizing unit.

The frequency analyzing unit 16' is constructed to apply a Fourier transform to the previously digitized input signals x(t), y(t) and z(t) applied to its first, second and third inputs, 15, 17 and 55 respectively, to produce Fourier-transformed versions $F_x(f)$, $F_y(f)$ and $F_z(f)$ of these signals, to compute a first and a second transfer function $H_{xy}(f)$ and $H_{zy}(f)$ respectively between the signals x(t) and y(t) and between the signals z(t) and y(t) respectively, and to compute partial coherence functions $\gamma^2_{xy.z}(f)$ for the signals x(t) and y(t) and $\gamma^2_{xy.x}(f)$ for the signals z(t) and y(t). Since the source 2 is an analog signal source two analog-to-digital converters 25 and 54 are arranged before the inputs 15 and 55 respectively of the frequency-analyzing unit 16'.

The frequency-analyzing unit 16' functions so that in determining the first and second control signals 10 and 50 respectively the values of the transfer functions $|H_{xy}|$ and $|H_{zy}|$ respectively for those frequencies $f_i$ for which the associated partial coherence functions $\gamma^2_{xy.z}(f)$ and $\gamma^2_{zy.x}(f)$ respectively have a value smaller than a specific fixed value, for example 0.8, are ignored.

Since the pick-up means 14 receive both the acoustic signal from the transducer unit 6 and that from the transducer unit 46 it is necessary to compute partial coherence functions because a computation and the use of the coherence functions as described above is not sufficient. The partial coherence function determines the degree of correspondence between two signals in a system with two or more inputs and one output and also has function values between 0 and 1, see (b), Chapter 5.4. In contradistinction to the embodiment of FIG. 1, in which the coherence function is employed for ignoring the unreliable information in the transfer function, partial coherence functions are now used. The method as described with reference to FIG. 1, in which that information in the transfer function is ignored for which the value is smaller than 1/x times the average value of the transfer function, can no longer be used in this case.

The reliable information in the transfer functions $|H_{xy}|$ are processed into the control signals 10 and 50 in the same way as described for the embodiment shown in FIG. 1. The two control signals 10 and 50 are applied to the equalizing unit 4 which comprises two equalizing-filter banks. One filter bank is coupled between input 7 and output 9 and is designated 56. This bank receives the control signal 10. The other filter bank 57, which is coupled between input 47 and output 49, receives the control signal 50. In this way both channels of the stereo signal can be corrected separately.

It is obvious that if the source 2 is a digital signal source the two analog-to-digital converters 25 and 54 may be dispensed with. Depending on whether the equalizing unit 4 is an analog or a digital equalizing unit two further digital-to-analog converters must be arranged before and after the equalizing unit respectively, one in each of the channels—from 1 to 12 and from 41 to 52.

Moreover, it is evident that the step of delaying, before the Fourier transform is applied, the signals fed to the inputs 15 and 55 respectively by a time interval corresponding to the propagation delays of the two signals from the transducer units 6 and 46 respectively to the pick-up means 14, which step has already been described with reference to FIGS. 1 and 5, may be applied again. The same applies to the step of limiting the length of the signals x(t), y(t) and z(t) by means of a time window, which step has also been described with reference to FIG. 1.

It is to be noted that the invention is not limited to the embodiments described in the foregoing. The scope of the invention also includes those embodiments which differ from the embodiments described with respect to points which do not relate to the inventive idea. In principle, the same applies to the frequency analyzing unit in accordance with the invention. Many of the functions of the frequency analyzing unit may be carried out by, for example, a microprocessor.

What is claimed is:

1. An arrangement for converting an electric signal into an acoustic signal, which arrangement comprises:
    an input terminal for receiving an electric input signal,
    an electro-acoustic transducer unit for converting an electric signal into an acoustic output signal,
    an equalizing unit having a first and a second input and an output, for correcting the frequency characteristic of said electric input signal, which is applied to its first input, under control of a control signal applied to its second input and for supplying the corrected electric signal on its output to said tranducer unit,
    pick-up means for detecting an acoustic signal and for generating an electric feedback signal which is a measure of the acoustic signal, and
    a frequency analyzing unit having a first input coupled to a point in the signal path between the input terminal and the first input of the equalizing unit, having a second input coupled to the pick-up means, and an output for supplying the control signal, which output is coupled to the second input of the equalizing unit, the improvement wherein analog/digital converter means convert said electric input signal and said feedback signal to respective digital signals, the frequency analyzing unit is constructed to subject the previously digitized digital input and feedback signals respectively applied to its first and second input to a Fourier transform, to provide Fourier-transformed versions $F_x(f)$ and $F_y(f)$ respectively of said signals, to calculate a transfer function from the said two versions, and to determine the control signal using the information in this transfer function.

2. An arrangement as claimed in claim 1, wherein said Fourier transform is a discrete Fourier transform.

3. An arrangement as claimed in claim 1, wherein the frequency analyzing unit further comprises means for computing a coherence function $\gamma^2_{xy}(f)$ between the two signals.

4. An arrangement as claimed in claim 5, wherein the frequency analyzing unit for determining the control signal, ignoring the values of the transfer function for those frequencies $f_i$ for which the coherence $\gamma^2_{xy}$ is smaller than a specific value.

5. An arrangement as claimed in claim 1, wherein the frequency analyzing unit comprises means for delaying, prior to the application of the Fourier transform, the signal applied to its first input relative to the signal applied to its second input by a time interval which at least substantially corresponds to the propagation delay of the acoustic output signal of the transducer unit to the pick-up means.

6. An arrangement as claimed in claim 5, wherein the frequency analyzing unit means for limiting the length of the two signals by means of a time window, after the signal applied to its first input has been delayed and before the Fourier transform is applied, the length of the time window corresponding substantially to the time interval within which the pick-up means detect the direct acoustic output signal of the transducer unit and a plurality of early reflections of the acoustic output signal of the transducer unit.

7. An arrangement as claimed in claim 1, wherein for the conversion of a stereophonic signal into an acoustic signal the arrangement is provided with a second input terminal for receiving a second electric input signal,
  a second electro-acoustic transducer unit for converting the second electric input signal into a second acoustic output signal,
  that the equalizing unit is further provided with a third and a fourth input and a second output and is constructed to correct the frequency characteristic of the second electric signal applied to its third input under the influence of a second control signal applied to its fourth input and to supply the corrected second electric signal to its second output, that the frequency analyzing unit is provided with a third input coupled to a point in the signal path between the second input terminal and the third input of the equalizing unit and a second output for supplying the second control signal, which second output is coupled to the fourth input of the equalizing unit, the frequency analyzing unit being moreover constructed
  to perform a Fourier transform on a previously digitized input signal z(t) applied to its third input,
  to provide a Fourier-transformed version $F_z(f)$ of this signal z(t),
  to compute a second transfer function from the said transformed version of the two signals z(t) and y(t),
  to determine the second control signal using the information in this second transfer function,
  to compute partial coherence functions $\gamma^2_{xy.z}(f)$ between the signals x(t) and y(t) and $\gamma^2_{zy.x}(f)$ between the signals z(t) and y(t), and is constructed to ignore, in determining the first and the second control signal respectively, the value of the first and the second transfer function respectively for those frequencies $f_i$ for which the partial coherence function $\gamma^2_{xy.z}(f)$ and $\gamma^2_{zy.x}(f)$ respectively has a value samller than a specific fixed value.

8. An arrangement as claimed in claim 7, wherein said fixed value is in a value range between 0.7 and 1.0.

9. An arrangement as claimed in claim 1, wherein said frequency analysing unit comprises means for determining the control signal, said means operating without the values of the transfer function for those frequencies $f_i$ for which the values of the transfer function are smaller than 1/x times the average value of the transfer function, x being a predetermined number.

10. An arrangement as claimed in claim 9, wherein said predetermined number is at least 20.

11. An arrangement as claimed in claim 1, wherein said Fourier transform is a fast Fourier transform.

* * * * *